(12) United States Patent
Yoshiike

(10) Patent No.: US 10,246,321 B2
(45) Date of Patent: Apr. 2, 2019

(54) MEMS DEVICE, LIQUID EJECTING HEAD, LIQUID EJECTING APPARATUS, METHOD FOR MANUFACTURING MEMS DEVICE

(71) Applicant: SEIKO EPSON CORPORATION, Tokyo (JP)

(72) Inventor: Masashi Yoshiike, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/698,459

(22) Filed: Sep. 7, 2017

(65) Prior Publication Data
US 2018/0093882 A1  Apr. 5, 2018

(30) Foreign Application Priority Data

Sep. 30, 2016 (JP) .................................. 2016-192983

(51) Int. Cl.
| | |
|---|---|
| B81B 7/00 | (2006.01) |
| B41J 2/14 | (2006.01) |
| B81C 1/00 | (2006.01) |
| B41J 2/16 | (2006.01) |

(52) U.S. Cl.
CPC .............. *B81B 7/007* (2013.01); *B41J 2/14* (2013.01); *B41J 2/14233* (2013.01); *B41J 2/161* (2013.01); *B41J 2/1607* (2013.01); *B41J 2/1621* (2013.01); *B41J 2/1626* (2013.01); *B41J 2/1628* (2013.01); *B41J 2/1629* (2013.01); *B41J 2/1631* (2013.01); *B81C 1/00301* (2013.01); *B41J 2002/14362* (2013.01); *B41J 2002/14491* (2013.01); *B81B 2201/052* (2013.01); *B81B 2207/07* (2013.01); *B81C 2201/013* (2013.01)

(58) Field of Classification Search
CPC .................................................... B41J 2/14072
See application file for complete search history.

(56) References Cited

U.S. PATENT DOCUMENTS

| | | | |
|---|---|---|---|
| 6,713,844 B2* | 3/2004 | Tatsuta ................. | H01L 21/563 174/535 |
| 7,960,830 B2* | 6/2011 | Lu ..................... | H01L 23/49811 257/734 |
| 2006/0024989 A1* | 2/2006 | Lindsey ............ | G01R 1/06733 439/66 |
| 2009/0032944 A1* | 2/2009 | Tanaka | |
| 2016/0276571 A1* | 9/2016 | Tanaka ................. | B41J 2/14201 |

FOREIGN PATENT DOCUMENTS

| | | | |
|---|---|---|---|
| JP | 08148339 A | * | 6/1996 |
| JP | 2009-260389 | | 11/2009 |

OTHER PUBLICATIONS

Machine generated English translation of JPH08-148339 to Sato et al., "Electronic Component and Magnetic Component"; translation obtained via https://worldwide.espacenet.com on Aug. 13, 2018; 16pp.*

* cited by examiner

*Primary Examiner* — Shelby L Fidler
(74) *Attorney, Agent, or Firm* — Workman Nydegger

(57) ABSTRACT

There is provided a MEMS device including: a substrate having a resin portion that protrudes from one surface thereof and is made of a resin, in which the first wiring extends along a first direction on the one surface from a position overlapping the resin portion to a position deviating from the resin portion, and in which a width of the resin portion is equal to or larger than a width of the first wiring covering the resin portion in a second direction intersecting the first direction.

3 Claims, 10 Drawing Sheets

MEMS DEVICE, LIQUID EJECTING HEAD, LIQUID EJECTING APPARATUS, METHOD FOR MANUFACTURING MEMS DEVICE

BACKGROUND

1. Technical Field

The present invention relates to a method for manufacturing a MEMS device including a wiring covering a resin and the surface of the resin as, for example, bump electrode and a method for manufacturing a liquid ejecting head.

2. Related Art

A micro electro mechanical systems (MEMS) device which includes a bump electrode electrically connecting between two substrates is applied to various apparatuses (for example, liquid ejecting apparatus, sensor, or the like). For example, a liquid ejecting head which is a type of MEMS device includes an actuator such as the bump electrode described above and a piezoelectric element and transmits a driving signal (electrical signal) to the actuator via the bump electrode. In addition, as the liquid ejecting apparatus on which such a liquid ejecting head is mounted, for example, there is an image recording apparatus such as an ink jet type printer and an ink jet type plotter. In addition, recently, the liquid ejecting head having a feature that a very small amount of liquid can be accurately landed to a predetermined position is developed and then is also applied to various manufacturing apparatuses. For example, the liquid ejecting head is applied to a display manufacturing apparatus for manufacturing a color filter such as a liquid crystal display, an electrode forming apparatus for forming an electrode such as an organic electro luminescence (EL) display and a face emitting display (FED), and a chip manufacturing apparatus for manufacturing a biochip (biochemical element). Liquid ink is ejected from a recording head for the image recording apparatus and a solution of each color material of red (R), green (G), and blue (B) is ejected from a color material ejecting head for the display manufacturing apparatus. In addition, a liquid electrode material is ejected from an electrode material ejecting head for the electrode forming apparatus, and a solution of a biological organic material is ejected from a biological material ejecting head for the chip manufacturing apparatus.

As the bump electrode, there is a bump electrode provided with a series of resin portions (resin layers) formed on the surface of the substrate and a wiring formed on the resin portion (see, for example, JP-A-2009-260389). Here, in a portion of the resin portion corresponding to space between adjacent wirings (that is, between the bump electrodes), the portion of the surface thereof is partly scraped by etching and becomes small. In other words, the height of the resin portion (dimension from substrate to upper surface of resin portion) between the adjacent wirings is formed to be lower than the height of the resin portion (that is, resin portion at portion covered with wiring) positioned immediately under the wiring (see, JP-A-2009-260389). Such a shape is formed by forming a wiring on the resin portion, using the wiring as a mask, and then etching the resin portion.

Here, in the etching of the resin portion, even if dry etching is used, the resin portion positioned immediately under the wiring is side-etched. In other words, as illustrated in FIG. 19, when a resin portion 91 formed on a substrate 90 using, for example, oxygen plasma is etched, the side surface of the resin portion 91 where the oxygen plasma is positioned immediately under a wiring 92 is slightly scraped. Therefore, the width of the resin portion 91 positioned immediately under the wiring 92 is smaller (thinner) than the width of the wiring 92 covering the resin portion, and a portion of the wiring 92 protrudes to the outside of the resin portion 91. As a result, for example, in a case where the resin portion 91 is pressed in a direction to crush so as to connect the wiring 92 of the bump electrode 93 to the terminal formed on the opposing substrate thereof, there is a fear that the bump electrode 93 is inclined or fallen down and shape thereof may collapse. When the shape of the bump electrode 93 collapses, the reliability of the electrical connection is reduced. The broken line arrows illustrated in FIG. 19 represent the flight images of the oxygen plasma.

SUMMARY

An advantage of some aspects of the invention is to provide a MEMS device, a liquid ejecting head, a liquid ejecting apparatus, and a method for manufacturing a MEMS device which can suppress decrease in reliability of electrical connection in a wiring stacked on the resin portion.

According to an aspect of the invention, there is provided a MEMS device including: a substrate having a resin portion that protrudes from one surface thereof and is made of a resin and a first wiring that covers at least a portion of a surface of the resin portion, in which the first wiring extends along a first direction on the one surface from a position overlapping the resin portion to a position deviating from the resin portion, and in which a width of the resin portion is equal to or larger than a width of the first wiring covering the resin portion in a second direction intersecting the first direction.

According to the configuration, since the width of the resin portion is formed to be equal to or larger than the width of the first wiring covering the resin portion, collapse of the shape of the resin portion can be suppressed. In other words, since the resin portion supporting the wiring is stable as a support base and becomes strong against stress and the like in the width direction, the shape of the resin portion is unlikely to collapse. As a result, a decrease in the reliability of the electrical connection in the first wiring stacked on the resin portion can be suppressed and in turn decrease in the reliability of the MEMS device can be suppressed.

In addition, in the configuration, it is preferable that the resin portion include a first portion and a second portion that is adjacent to the first portion along the second direction and of which a height from the one surface is lower than that of the first portion, the first wiring be provided at a position overlapping the first portion, and a width of the first portion be equal to or larger than the width of the first wiring covering the first portion in the second direction.

According to the configuration, the height from the one surface of the portion to be the terminal of the first wiring becomes relatively high and electrical connection with the corresponding terminal can be likely to be established. In addition, since the second portion supports the first portion, the collapse of the shape of the resin portion can be suppressed when the resin portion is pressed in a direction to crush.

Further, in the configuration, it is preferable that the MEMS device further including: a second wiring between the first portion and the first wiring and a width of the second wiring be equal or larger than the width of the first wiring covering the first portion in the second direction.

According to the configuration, in a case where the second wiring functions as an adhesion layer between the first wiring and the resin portion, adhesion of the first wiring can be secured more reliably.

In addition, in the configuration, it is preferable that the width of the second wiring be larger than the width of the first portion in the second direction.

According to the configuration, when the resin portion is etched using the first wiring and the second wiring as a mask, even if the first portion is side-etched, it is possible to suppress that the width of the first portion is smaller (thinner) than the width of the first wiring.

Further, in the configuration, it is preferable that the width of the second wiring be equal to or smaller than the width of the first portion in the second direction.

According to the configuration, peeling of the second wiring from the first portion can be suppressed.

In addition, according to another aspect of the invention, there is provided a liquid ejecting head which includes a nozzle for ejecting a liquid, comprising: a structure of the MEMS device of any one of the above configurations.

According to the configuration, a decrease in the reliability of the liquid ejecting head can be suppressed.

Further, according to still another aspect of the invention, there is provided a liquid ejecting apparatus including the liquid ejecting head having the above configuration.

According to the configuration, decrease in the reliability of the liquid ejecting apparatus can be suppressed.

According to still another aspect of the invention, there is provided a method for manufacturing a MEMS device, the MEMS device including a substrate having a resin portion that protrudes from one surface thereof and is made of a resin, a first wiring that covers at least a portion of the surface of the resin portion, and a second wiring that is disposed between the resin portion and the first wiring, in which the first wiring and the second wiring extend along a first direction on the one surface from a position overlapping the resin portion to a position deviating from the resin portion, the method including: a resin portion forming step of forming the resin portion on the one surface of the substrate; a conductive film forming step of forming a film by overlapping a first conductive film to be the first wiring on a second conductive film after forming the second conductive film which becomes the second wiring on the one surface including a region on which the resin portion is formed; a first etching step of forming the first wiring and the second wiring by etching the first conductive film and the second conductive film; a second etching step of making the width of the first wiring in a second direction intersecting the first direction smaller than the width of the second wiring in the second direction by etching the first wiring, after the first etching step; and a third etching step of etching the resin portion by using the first wiring and the second wiring as a mask, after the second etching step.

According to the method, the MEMS device in which the width of the resin portion is formed to be equal to or larger than the width of the first wiring can be manufactured. In other words, the MEMS device in which decrease in reliability is suppressed can be manufactured.

In addition, it is preferable that the method for manufacturing a MEMS device further include a fourth etching step of making the width of the second wiring in the second direction smaller than the width of the resin portion in the second direction by etching the second wiring, after the third etching step.

According to the method, the MEMS device in which the width of the second wiring is formed to be equal to or smaller than the width of the resin portion can be manufactured. As a result, peeling of the second wiring from the resin portion can be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
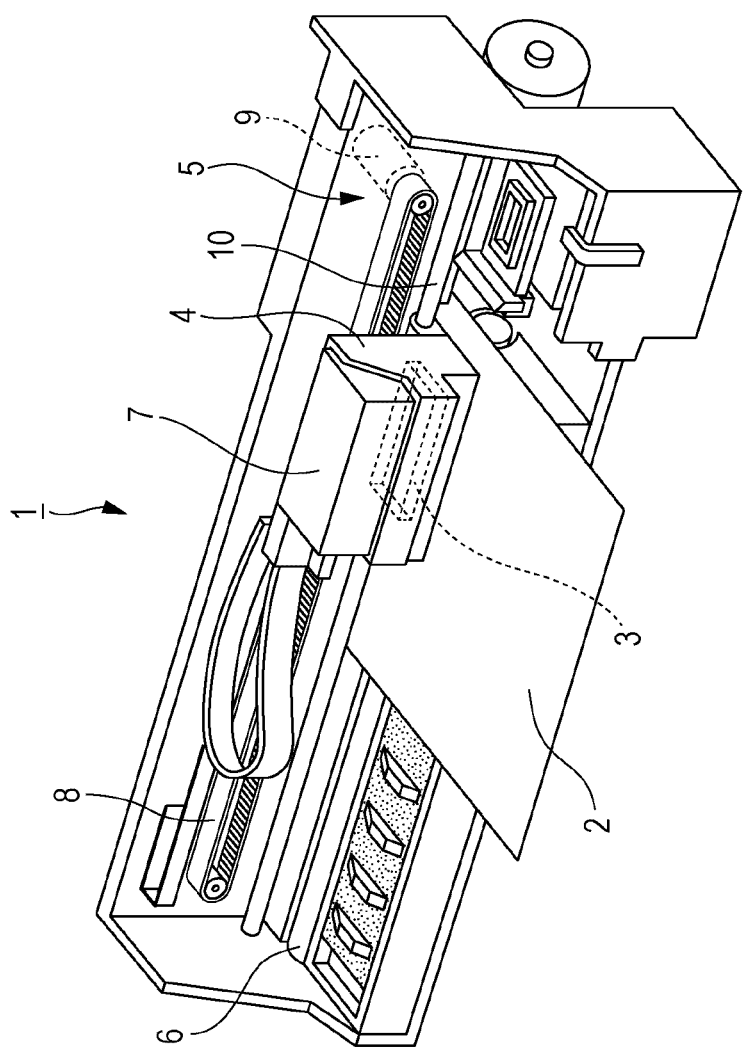
FIG. 1 is a perspective view illustrating a configuration of a printer.

Hereinafter, aspects for realizing the invention will be described with reference to the attached drawings. In the embodiments described below, although various limitations have been made as preferred specific examples of the invention, the scope of the invention is not limited to the aspects unless specifically stated to limit the invention in the following description. In addition, in the following description, a liquid ejecting head which is one category of a MEMS device, in particular, an ink jet type recording head (hereinafter recording head) 3, which is a type of liquid ejecting head, will be described as an example. FIG. 1 is a perspective view illustrating an ink jet printer (hereinafter, printer) 1 which is a kind of a liquid ejecting apparatus on which a recording head 3 is mounted.

The printer 1 is an apparatus that ejects ink (a type of liquid) onto a surface of a recording medium 2 (a kind of landing target) such as a recording paper and records an image or the like. The printer 1 includes a recording head 3, a carriage 4 to which the recording head 3 is attached, a carriage moving mechanism 5 which moves the carriage 4 in the main scanning direction, a transport mechanism 6 which transports the recording medium 2 in the sub scanning direction, and the like. Here, the ink is stored in the ink cartridge 7 as a liquid supply source. The ink cartridge 7 is detachably mounted on the recording head 3. A configuration in which the ink cartridge is disposed on the main body side of the printer and ink is supplied from the ink cartridge to the recording head through an ink supply tube can be adopted.

The carriage moving mechanism 5 includes a timing belt 8. The timing belt 8 is driven by a pulse motor 9 such as a DC motor. Therefore, when the pulse motor 9 is operated, the carriage 4 is guided by a guide rod 10 installed on the printer 1 and thus reciprocates in the main scanning direction (in width direction of recording medium 2). A position of the carriage 4 in the main scanning direction is detected by a linear encoder (not illustrated) which is a type of position information detecting means. The linear encoder transmits the detection signal thereof, that is, the encoder pulse (a kind of position information) to a controller of the printer 1.

Figure 2:
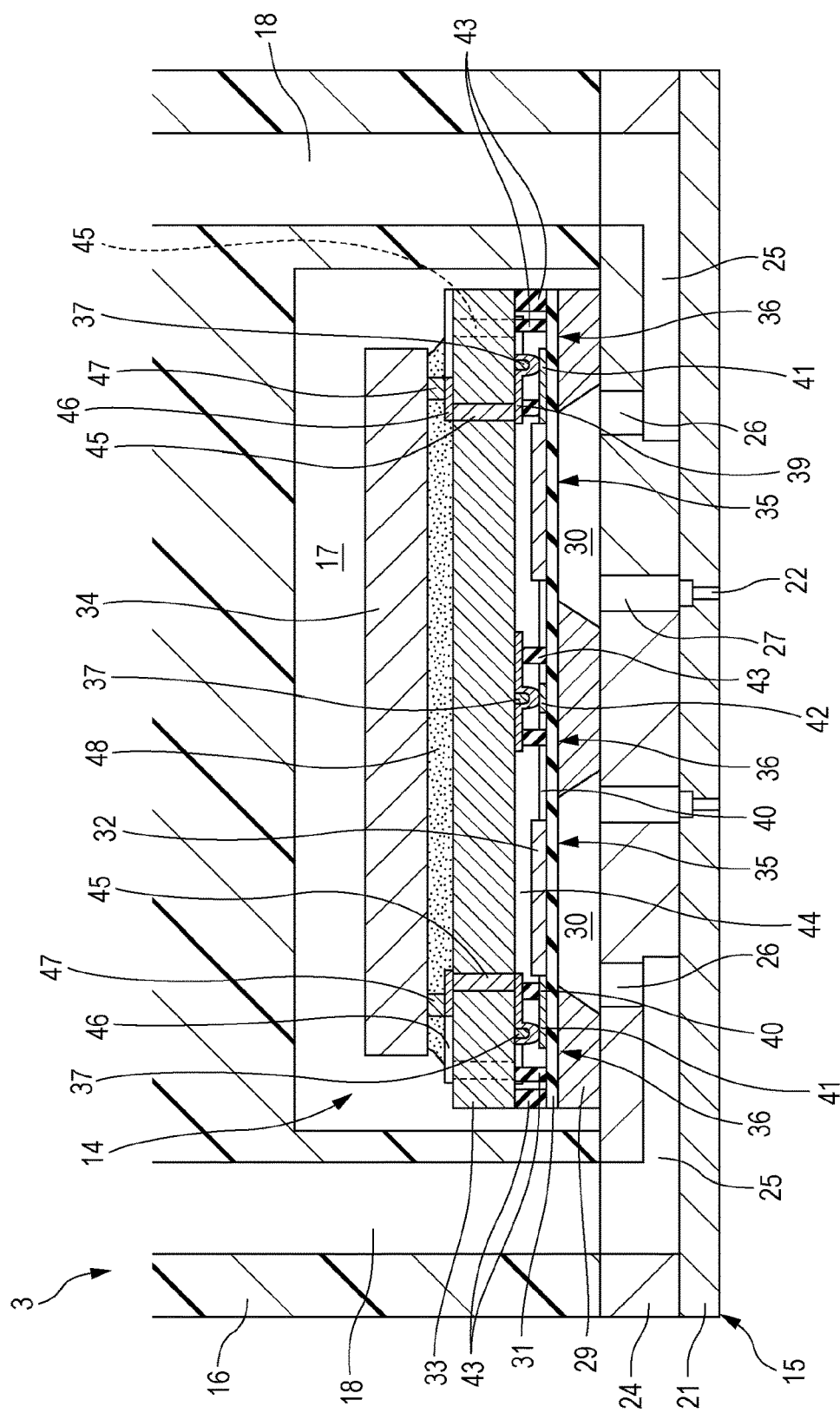
FIG. 2 is a cross-sectional view illustrating a configuration of a recording head.

Next, the recording head 3 will be described. FIG. 2 is a cross-sectional view illustrating the configuration of the recording head 3. In the following description, a stacking direction of each member is appropriately described as a vertical direction. As illustrated in FIG. 2, the recording head 3 in the present embodiment is attached to a head case 16 in a state where an actuator unit 14 and a flow path unit 15 are stacked.

The head case 16 is a box-like member made of synthetic resin, and a liquid introduction path 18 which supplies ink to each pressure chamber 30 is formed inside the head case 16. The liquid introduction path 18 is space in which ink common to a plurality of pressure chambers 30 is stored along with a common liquid chamber 25 to be described below. In the present embodiment, two liquid introduction paths 18 are formed corresponding to the rows of pressure chambers 30 arranged in two rows in parallel. In addition, in a portion on the lower side of the head case 16 (side of flow path unit 15), an accommodation space 17 which is recessed in a rectangular parallelepiped shape from the lower surface of the head case 16 (surface of the flow path unit 15 side) to the middle of the head case 16 in the height direction is formed. When the flow path unit 15 to be described below is bonded in a state of being positioned on the lower surface of the head case 16, the actuator unit 14 (pressure chamber forming substrate 29, sealing plate 33, driving IC 34, or the like) stacked on a communication substrate 24 is configured to be accommodated in an accommodation space 17. Although not illustrated in the drawing, an opening which communicates the space outside the head case 16 and the accommodation space 17 with each other is formed in a portion of the ceiling surface of the accommodation space 17. A wiring substrate such as a flexible printed board (FPC) (not illustrated) is inserted through the opening into the accommodation space 17 and is connected to the actuator unit 14 in the accommodation space 17. Therefore, the accommodation space 17 is space opened to the atmosphere.

The flow path unit 15 in this embodiment includes the communication substrate 24 and a nozzle plate 21. The nozzle plate 21 is a substrate which is bonded to the lower surface (surface opposite to pressure chamber forming substrate 29) of the communication substrate 24 and is made of silicon. In the present embodiment, an opening on the lower surface side of space to be described below, which is the common liquid chamber 25, is sealed by the nozzle plate 21. In addition, a plurality of nozzles 22 are formed linearly (in a row) on the nozzle plate 21. Two rows of the nozzles 22 (that is, nozzle rows) which includes the plurality of nozzles 22 are formed in the nozzle plate 21. The nozzles 22 constituting each nozzle row are provided at a pitch corresponding to the dot formation density from the nozzle 22 of one end side to the nozzle 22 of the other end side, for example, at equal interval along the sub scanning direction. The nozzle plate is bonded to a region that is deviated from the common liquid chamber to the inside in the communication substrate and the opening on the lower surface side of the space which becomes the common liquid chamber can be sealed by a member such as a flexible compliance sheet.

The communication substrate 24 is a substrate which constitutes the upper portion (portion on head case 16 side) of the flow path unit 15 and is made of silicon. As illustrated in FIG. 2, a common liquid chamber 25 which communicates with the liquid introduction path 18 and stores ink common to the respective pressure chambers 30, an individual communication path 26 which separately supplies ink from the liquid introduction path 18 to each pressure chamber 30 via the common liquid chamber 25, and a nozzle communication path 27 which communicates the pressure chamber 30 and the nozzle 22 with each other are formed on the communication substrate 24 by etching or the like. The common liquid chamber 25 is an elongated empty portion along the direction of the nozzle row, and as illustrated in FIG. 2, it is formed in two rows corresponding to the rows of the pressure chambers 30 arranged in two rows in parallel. In addition, a plurality of individual communication paths 26 and a plurality of nozzle communication paths 27 are formed along the nozzle row direction.

As illustrated in FIG. 2, the actuator unit 14 in the present embodiment is bonded to the communication substrate 24 in a state where a pressure chamber forming substrate 29, a vibration plate 31, a piezoelectric element 32 which is a type of actuator, a sealing plate 33, and a driving IC 34 are stacked to be a unit. The actuator unit 14 is formed to be smaller than the accommodation space 17 so as to be capable of being accommodated in the accommodation space 17.

The pressure chamber forming substrate 29 is a substrate made of silicon which constitutes a lower portion (portion on flow path unit 15 side) of the actuator unit 14. A plurality of spaces serving as the pressure chambers 30 are arranged in parallel along the nozzle row direction by a portion of the pressure chamber forming substrate 29 being removed in a plate thickness direction by etching or the like. A lower side of the space is defined by the communication substrate 24 and an upper side thereof is defined by the vibration plate 31 to constitute the pressure chamber 30. In addition, this space, that is, the pressure chamber 30 is formed in two rows corresponding to the nozzle rows formed in two rows. Each of the pressure chambers 30 is an empty portion elongated in a direction orthogonal to the nozzle row direction, the individual communication path 26, communicates with an end portion on a side, and the nozzle communication path 27 communicates with an end portion on the other side thereof in the longitudinal direction.

The vibration plate 31 is an elastic thin film member and is stacked on the upper surface (surface opposite to flow path unit 15 side) of the pressure chamber forming substrate 29. An upper opening of the space serving as the pressure chamber 30 is sealed by the vibration plate 31. In other words, the pressure chamber 30 is defined by the vibration plate 31. A portion of the vibration plate 31 corresponding to the pressure chamber 30 (specifically, upper opening of pressure chamber 30) functions as a displacement portion that is displaced in a direction away from or close to the nozzle 22 in accordance with flexural deformation of the piezoelectric element 32. In other words, a region of the vibration plate 31 corresponding to the upper opening of the pressure chamber 30 becomes a driving region 35 in which the flexural deformation is permitted. On the other hand, a region of the vibration plate 31 deviated from the upper opening of the pressure chamber 30 becomes a non-driving region 36 where flexural deformation is inhibited.

In addition, the vibration plate 31 includes, for example, an elastic film which is made of silicon dioxide ($SiO_2$) formed on an upper surface of the pressure chamber forming substrate 29 and an insulating film which is made of zirconium oxide ($ZrO_2$) formed on the elastic film. Piezoelectric elements 32 are stacked on a region corresponding to the respective pressure chambers 30 on the insulating film (surface on side opposite to pressure chamber forming substrate 29 side of vibration plate 31), that is, the driving region 35. The piezoelectric element 32 in the present embodiment is a so-called flexural mode of piezoelectric element. The piezoelectric element 32 is formed by a lower electrode layer, a piezoelectric layer, and an upper electrode layer, for example, on the vibration plate 31 being sequentially stacked. Any one of the upper electrode layer or the lower electrode layer becomes a common electrode formed commonly on the respective piezoelectric elements 32 and the other thereof becomes an individual electrode individually formed on each piezoelectric element 32. When an electric field corresponding to potential difference between the lower electrode layer and the upper electrode layer is applied between the lower electrode layer and the upper electrode layer, the piezoelectric element 32 deforms to be flexural in a direction away from or close to the nozzle 22. The piezoelectric elements 32 in the present embodiment are formed in two rows along the nozzle row direction corresponding to the pressure chambers 30 arranged in two rows in parallel along the nozzle row direction.

Figure 4:
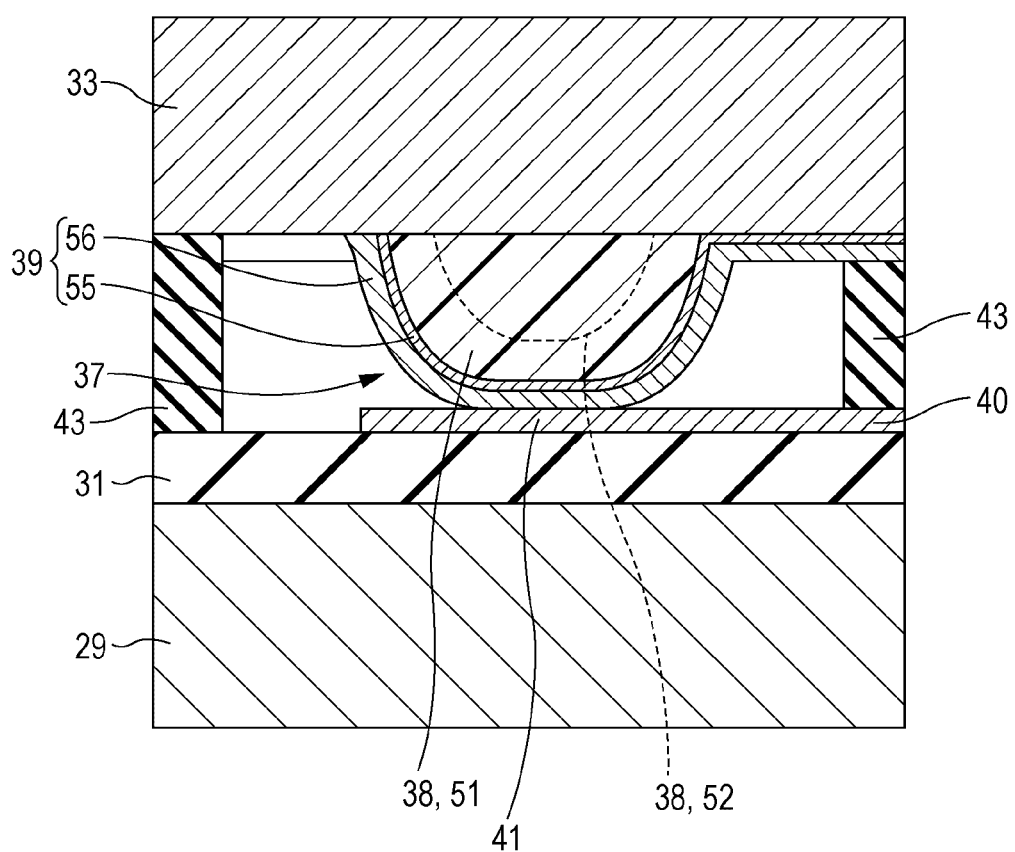
FIG. 4 is a cross-sectional view taken along line IV-IV in FIG. 3.

In addition, as illustrated in FIG. 2 and FIG. 4, a lead wiring 40 to which the individual electrode or the common electrode of the piezoelectric element 32 is connected is formed on the vibration plate 31. The lead wiring 40 extends (extends and installed) to the non-driving region 36 of the vibration plate 31 and functions as a terminal to be connected to the bump electrode 37 (to be described below) in the non-driving region 36. In other words, as illustrated in FIG. 2, an individual terminal 41 connected to the individual electrode of the piezoelectric element 32 and a common terminal 42 connected to the common electrode of the piezoelectric element 32 are formed in the non-driving region 36 on the upper surface (surface facing sealing plate 33) of the vibration plate 31. Specifically, in a direction orthogonal to the nozzle row direction, the individual terminals 41 are formed on the outside of the row of one piezoelectric element 32 and the outside of the row of the other piezoelectric element 32 and the common terminal 42 is formed between rows of both piezoelectric elements 32. Since the individual terminal 41 is connected to the individual electrode of the piezoelectric element 32, the individual terminal 41 is formed for each piezoelectric element 32. For example, a plurality of individual terminals 41 are formed along the nozzle row direction. On the other hand, since the common terminal 42 is connected to the common electrode of the piezoelectric element 32, at least one common terminal 42 is formed. In the present embodiment, the common terminal 42 is connected to both the common electrode on the row of one piezoelectric element 32 and the common electrode on the row of the other piezoelectric element 32.

As illustrated in FIG. 2, the sealing plate 33 (corresponding to substrate in the invention) is a substrate made of silicon which is disposed at an interval from the vibration plate 31 in a state where a photosensitive adhesive 43 having an insulating property is interposed between the sealing plate 33 and the vibration plate 31. In the present embodiment, on the lower surface (corresponding to one surface in the invention) which is the surface of the sealing plate 33 on the side of the pressure chamber forming substrate 29, a plurality of bump electrodes 37 which output a driving signal from the driving IC 34 to the piezoelectric element 32 side are formed. As illustrated in FIG. 2, the bump electrode 37 is formed at a position corresponding to one individual terminal 41 formed on the outside of one piezoelectric element 32, a position corresponding to the other individual terminal 41 formed outside the other piezoelectric element 32, a position corresponding to the common terminal 42 formed between the rows of the piezoelectric elements 32, and the like. Each bump electrode 37 is connected to corresponding the individual terminal 41 or the common terminal 42, respectively. More specifically, a conductive film 39 (base film 55 and electrode film 56) to be described below is electrically connected to the corresponding individual terminal 41 or the common terminal 42. The sealing plate 33 and the pressure chamber forming substrate 29 are bonded in a state where the individual terminal 41 and the common terminal 42 corresponding to each bump electrode 37 are pressed in a direction to be brought close to each other so that the individual terminal 41 and the common terminal 42 are reliably electrically connected.

As illustrated in FIG. 4, the bump electrode 37 in the present embodiment includes a resin portion 38 made of a resin protruding from the lower surface of the sealing plate 33 and the conductive film 39 which covers at least a portion of the surface (specifically, surface of side opposite to surface which is contact with lower surface of sealing plate 33) of the resin portion 38 and is a so-called resin core bump. The conductive film 39 is formed at a position corresponding to the individual terminal 41 or the common terminal 42 on the surface of the resin portion 38. Specifically, a plurality of conductive films 39 of the bump electrodes 37 which is electrically connected to the individual terminals 41 are formed along the nozzle row direction corresponding to the individual terminals 41 arranged along the nozzle row direction in parallel. In addition, at least one conductive film 39 electrically connected to the common terminal 42 is formed corresponding to the common terminal 42. Then, the resin portion 38 is connected to the individual terminal 41 or the common terminal 42 in a state of slightly collapsing in the height direction with the conductive film 39 interposed therebetween. In other words, the bump electrode 37 is connected to the individual terminal 41 or the common terminal 42 in a state of slightly collapsing in the height direction. As illustrated in FIG. 2, the conductive film 39 of the bump electrode 37 is extended (extended and installed) to a position deviated from the resin portion 38 and covers the lower end of the through wiring 45 penetrating the sealing plate 33 in the plate thickness direction. Accordingly, the conductive film 39 is connected to the upper surface side wiring 46 stacked on the upper surface (surface on side opposite to pressure chamber forming substrate 29) of the sealing plate 33 via the through wiring 45. The structure of the bump electrode 37 will be described below in detail.

The photosensitive adhesive 43 for adhering the sealing plate 33 and the pressure chamber forming substrate 29 (more specifically, vibration plate 31 stacked on pressure chamber forming substrate 29) to each other is an adhesive that has photosensitivity in which the curing degree changes by light irradiation and a thermosetting property in which the curing degree changes by heating. As the photosensitive adhesive 43 described above, for example, a resin including an epoxy resin, an acrylic resin, a phenol resin, a polyimide resin, a silicone resin, a styrene resin or the like as a main component is suitably used. In addition, as illustrated in FIG. 2, the photosensitive adhesive 43 in the present embodiment is provided on the outer peripheral portion of the sealing plate 33 and on both sides of the bump electrode 37 in the direction orthogonal to the nozzle row direction. A sealing space 44 is formed between the sealing plate 33 and the pressure chamber forming substrate 29 by the photosensitive adhesive 43 provided on the outer peripheral portion of the sealing plate 33. In other words, the sealing space 44 is defined by the photosensitive adhesive 43 provided on the sealing plate 33, the pressure chamber forming substrate 29 (vibration plate 31), and the outer peripheral portion of the sealing plate 33. Therefore, the piezoelectric element 32 is accommodated in the sealing space 44. Since the sealing space 44 is open to the atmosphere via an atmospheric release path (not illustrated) having a small diameter passing through the sealing plate 33, the sealing space is not a completely sealing space. In addition, the photosensitive adhesive 43 provided on both sides of the bump electrode 37 is formed to be long along the extending direction of the resin portion 38, respectively.

The driving IC 34 is stacked on the upper surface of the sealing plate 33. The driving IC 34 is an IC chip for driving the piezoelectric element 32, and is fixed to the upper surface of the sealing plate 33 via an adhesive 48 such as an anisotropic conductive film (ACF). As illustrated in FIG. 2, a plurality of IC terminals 47 connected to terminal portions of the upper surface side wiring 46 are formed on the lower surface (surface on sealing plate 33 side) of the driving IC 34. A plurality of IC terminals 47 corresponding to the individual terminals 41 of the IC terminals 47 is arranged in parallel along the nozzle row direction. In the present embodiment, two rows of IC terminals 47 are formed corresponding to the rows of piezoelectric elements 32 arranged in two rows in parallel.

The recording head 3 having the configuration described above introduces the ink from an ink cartridge 7 into the pressure chamber 30 via the liquid introduction path 18, the common liquid chamber 25, the individual communication path 26, and the like. In this state, when a driving signal from the driving IC 34 is supplied to the piezoelectric element 32 via the bump electrode 37, the lead wiring 40, or the like, the piezoelectric element 32 is driven to cause pressure variation in the ink in the pressure chamber 30. By using this pressure fluctuation, the recording head 3 ejects ink droplets from the nozzles 22.

Figure 3:
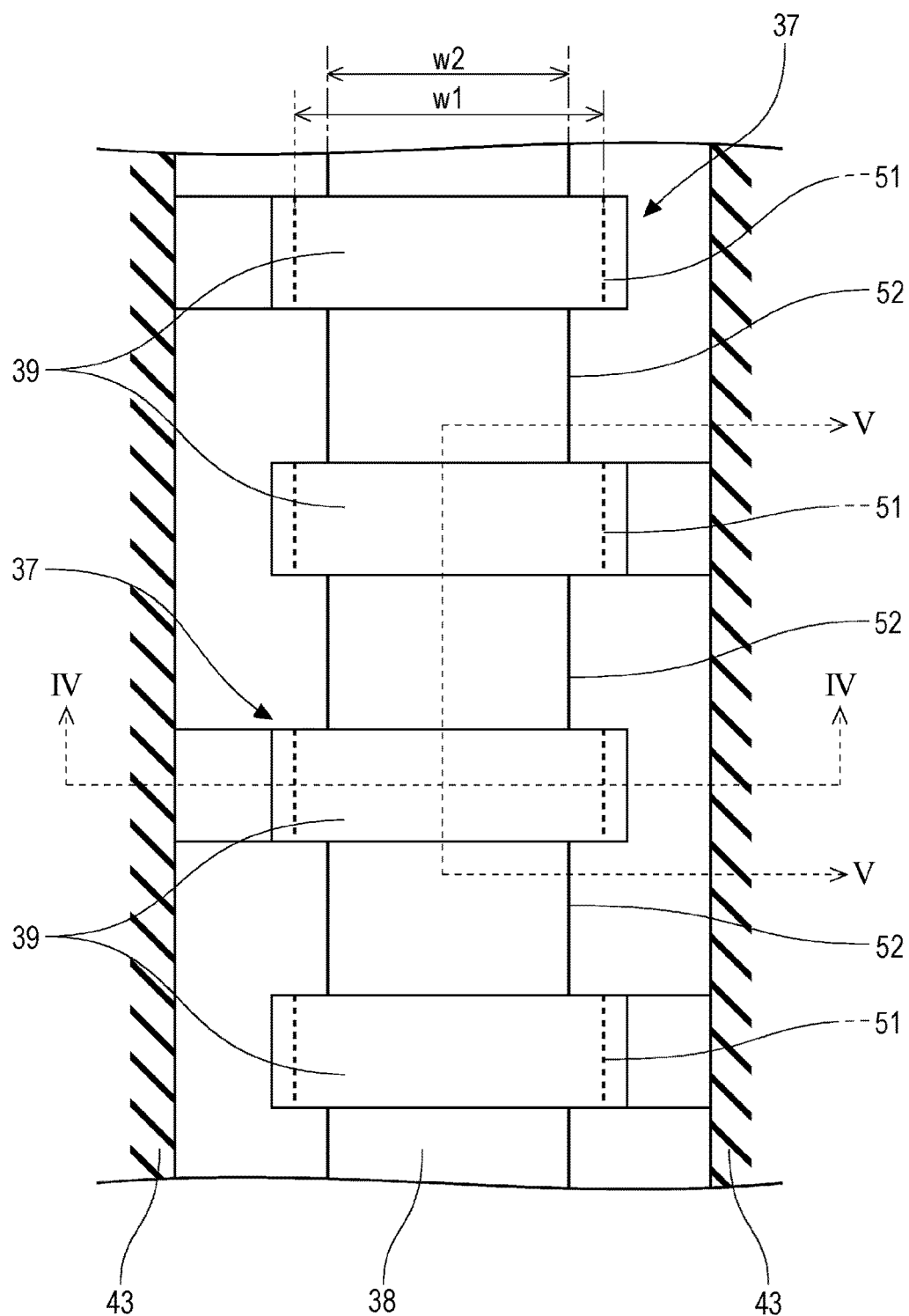
FIG. 3 is an enlarged plan view of a main portion of a sealing plate.

Next, the configuration of the bump electrode 37 will be described in detail. FIG. 3 illustrates a plan view of a portion of a region where the bump electrode 37 connected to one individual terminal 41 (the left side in FIG. 2) is formed as viewed from the lower surface side (pressure chamber forming substrate 29 side) of the sealing plate 33. In addition, FIG. 4 is a cross-sectional view taken along line IV-IV in FIG. 3 and FIG. 5 is a cross-sectional view taken along line V-V in FIG. 3.

The resin portion 38 of the bump electrode 37 connected to the individual terminal 41 is made of, for example, an elastic resin such as a polyimide resin, a phenol resin, an epoxy resin or the like, and as illustrated in FIG. 3 or the like, is formed in a ridge along the nozzle row direction (corresponding to second direction in the invention) on the surface of the sealing plate 33. The resin portion 38 in the present embodiment is disposed between the photosensitive adhesives 43 formed in two rows outside the row of the piezoelectric elements 32. In addition, as illustrated in FIG. 4, the surface of the resin portion 38 (in detail, surface on vibration plate 31 side) is formed in a circular arc shape in a cross section in a direction intersecting the nozzle row direction. Further, as illustrated in FIG. 3 to FIG. 5, a conductive film 39 is stacked on the surface of a portion of the resin portion 38 corresponding to the individual terminal 41. A plurality of the conductive films 39 are formed at intervals in the nozzle row direction corresponding to the individual terminals 41. Therefore, in the resin portion 38, the first portion 51 covered with the conductive film 39 and the second portion 52 which is deviated from the conductive film 39, is not covered with the conductive film 39, and is exposed from the conductive film 39 are alternatively formed along the nozzle row direction. Each of the conductive films 39 extends along a direction intersecting the nozzle row direction (corresponding to first direction in the invention) from a region overlapping the resin portion 38 to a region corresponding to the through wiring 45 on the outside thereof. In the present embodiment, the conductive films 39 of the adjacent bump electrodes 37 are taken out in different directions. In other words, a conductive film 39 taken out from a region overlapping the resin portion 38 to one side thereof and a conductive film 39 taken out from the region overlapping the resin portion 38 to the other side thereof are formed alternately along the nozzle row direction. Each of the conductive films 39 is not limited to the configuration described above and it is also possible to adopt a configuration in which the conductive films 39 are taken out to the same side.

Figure 5:
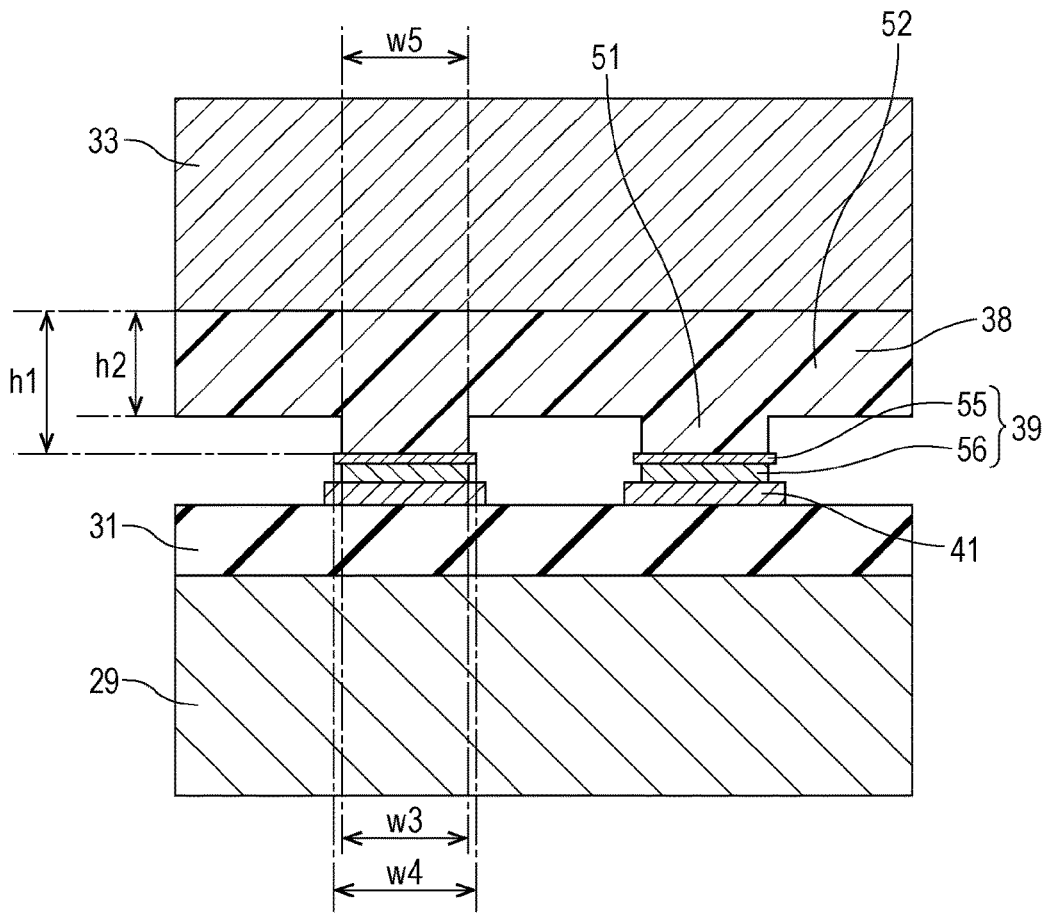
FIG. 5 is a cross-sectional view taken along line V-V in FIG. 3.

In addition, as illustrated in FIG. 3 to FIG. 5, the second portion 52 of the resin portion 38 which is not covered with the conductive film 39 is formed to be smaller than the first portion 51 covered with the conductive film 39 by dry etching. In other words, the dimension w2 of the second portion 52 in the direction intersecting the nozzle row direction is formed to be smaller than the dimension w1 of the first portion 51 in a direction intersecting the nozzle row direction. In other words, the dimension w1 of the first portion 51 in the direction intersecting the nozzle row direction is formed to be larger than the dimension w2 of the second portion 52 in the direction intersecting the nozzle row direction. In addition, the height h2 (dimension from lower surface to the top portion of sealing plate 33) of the second portion 52 is formed to be lower than the height h1 of the first portion 51. In other words, the height h1 of the first portion 51 is formed to be higher than the height h2 of the second portion 52. In summary, the resin portion 38 is alternately formed with a first portion 51 having a relatively high height from the lower surface of the sealing plate 33 and a second portion 52 having a relatively low height from the lower surface of the sealing plate 33 along the nozzle row direction. The conductive film 39 is formed at a position overlapping the first portion 51.

Further, as illustrated in FIG. 4 and FIG. 5, the conductive film 39 is formed by stacking the base film 55 (corresponding to second wiring in the invention) and the electrode film 56 (corresponding to first wiring in the invention) in this order from the lower surface side of the sealing plate 33. In other words, the base film 55 is formed between the electrode film 56 and the resin portion 38 (more specifically, first portion 51) and between the electrode film 56 and the lower surface of the sealing plate 33. In addition, the electrode film 56 is a layer constituting the outermost layer of the conductive film 39 and is in contact with terminals such as the individual terminal 41. The base film 55 is made of, for example, titanium (Ti), nickel (Ni), chromium (Cr), tungsten (W), alloys thereof, stacked ones thereof or the like and has corrosion resistance and conductivity. In addition, the electrode film 56 is made of gold (Au) or the like. Therefore, the base film 55 functions not only as a protective film for covering and protecting the through wiring 45 but also as an adhesion layer for increasing the adhesion of the electrode film 56. Furthermore, the base film 55 can also function as a barrier layer for suppressing metal diffusion occurring between the electrode film 56 and the through wiring 45. By suppressing metal diffusion, fluctuation in resistance value thereof can be reduced and reliability thereof can be improved.

Here, in the bump electrode 37, the width w5 of the resin portion 38 (specifically, width of first portion 51) constituting the bump electrode 37 in the nozzle row direction (that is, extending direction of resin portion 38) is equal to or greater than the width w3 of the electrode film 56 covering the first portion 51. In the present embodiment, as illustrated in FIG. 5, the width w5 of the first portion 51 and the width w3 of the electrode film 56 covering the first portion 51 are formed to have substantially the same width. In addition, in the nozzle row direction, the width w4 of the base film 55 is formed to be larger than the width w5 of the first portion 51 and the width w3 of the electrode film 56 covering the first portion 51. In other words, the width w5 of the first portion 51 and the width w3 of the electrode film 56 covering the first portion 51 are formed to be smaller than the width w4 of the base film 55. The width w3 of the electrode film 56 and the width w4 of the base film 55 can be formed to have the same width. In other words, the width w4 of the base film 55 may be equal to or larger than the width w3 of the electrode film 56 covering the first portion 51.

In this manner, by configuring the width w5 of the first portion 51 to be equal to or larger than the width w3 of the electrode film 56, the collapse of the shape of the bump electrode 37 can be suppressed. For example, when the bump electrode 37 is connected to the opposing terminal (individual terminal 41 or the like), even if the electrode film 56 which is in contact with the terminal is pressed in the height direction of the bump electrode 37, the first portion 51 can receive the pressure. Accordingly, it is possible to suppress inclination and falling of the bump electrode 37. In other words, since the first portion 51 supporting the electrode film 56 is stabilized as a support base, particularly the first portion is strong against stress and the like in the width direction (extending direction of the resin portion 38), the shape of the bump electrode 37 is unlikely to collapse. As a result, decrease in the reliability of the electrical connection in the bump electrode 37 (electrode film 56 stacked on the resin portion 38) can be suppressed, and in turn, a decrease in the reliability of the recording head 3 can be suppressed. In addition, since the resin portion 38 between the bump electrodes 37 becomes the second portion 52 having a relatively low height from the lower surface of the sealing plate 33, the height of the bump electrode 37, specifically, the height of the portion (that is, portion connected to the corresponding terminal (the individual terminal 41 or the like)) to be the terminal of the electrode film 56 becomes relatively high and thus the bump electrode 37 is likely to be electrically connected to the corresponding terminal. In addition, the second portion 52 can reinforce the strength of the first portion 51 in the nozzle row direction, and can suppress the collapse of the shape of the first portion 51. In other words, since the second portion 52 supports the first portion 51, collapse of the shape of the resin portion 38 can be suppressed when the resin portion 38 is pressed in a crush direction. Accordingly, decrease in the reliability of the electrical connection at the bump electrode 37 can be further suppressed. Furthermore, since the width w4 of the base film 55 is configured to be equal to or larger than the width w3 of the electrode film 56, the base film 55 can function sufficiently as an adhesion layer, and the adhesion of the electrode film 56 can be more reliably secured. Since the width w4 of the base film 55 is formed larger than the width w5 of the first portion 51, when the resin portion 38 is etched using the conductive film 39 as a mask to form the second portion 52, it is possible to suppress that the width w5 of the first portion 51 is smaller (thinner) than the width w3 of the electrode film 56 even if the first portion 51 is side-etched. Accordingly, collapse of the shape of the bump electrode 37 can be suppressed. This point will be described in detail below.

Figure 6:
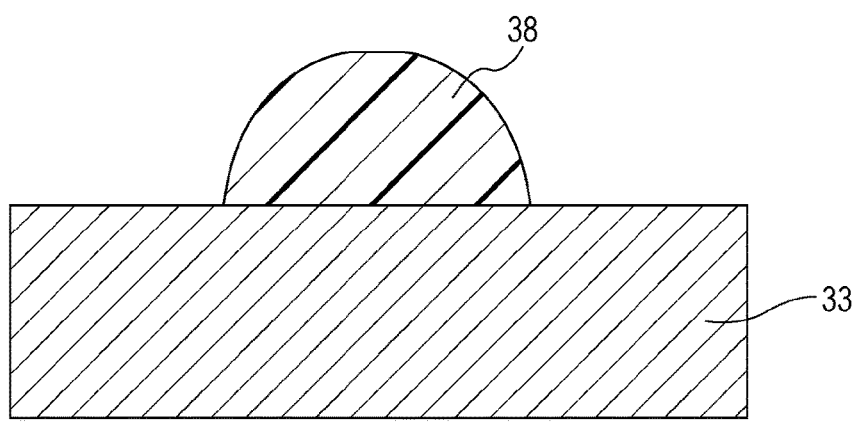
FIG. 6 is a state transition diagram of a cross section of the sealing plate in a direction orthogonal to an extending direction of the resin portion, which illustrates a method for forming a bump electrode.
Figure 7:
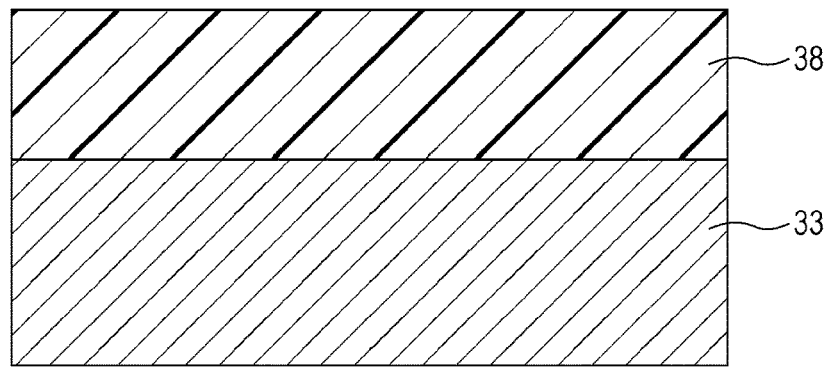
FIG. 7 is a state transition diagram of the cross section of the sealing plate in the extending direction of the resin portion, which illustrates the method for forming the bump electrode.
Figure 8:
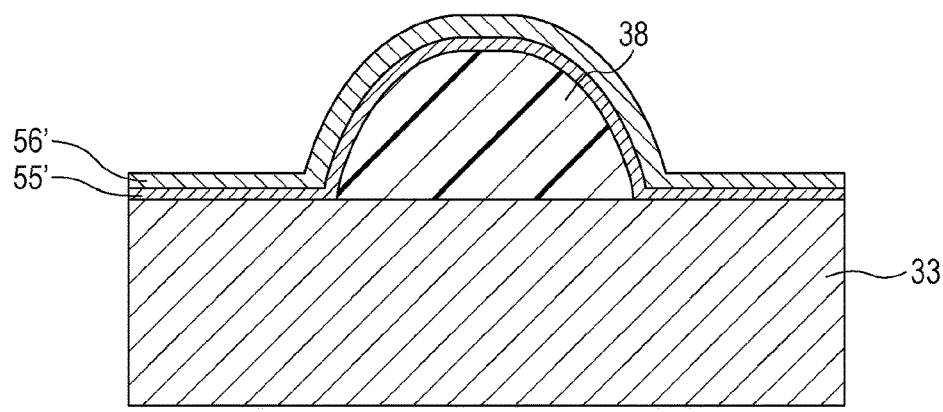
FIG. 8 is a state transition diagram of the cross section of the sealing plate in the direction orthogonal to the extending direction of the resin portion, which illustrates the method for forming the bump electrode.
Figure 10:
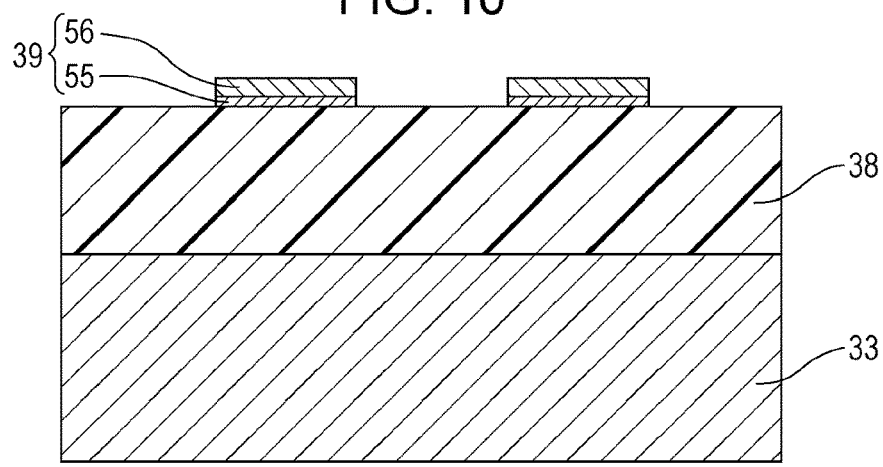
FIG. 10 is a state transition diagram of the cross section of the sealing plate in the extending direction of the resin portion, which illustrates the method for forming the bump electrode.
Figure 11:
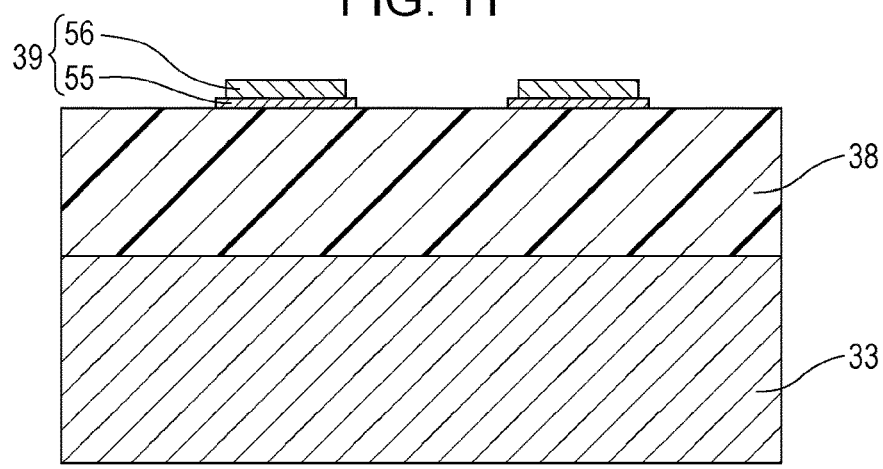
FIG. 11 is a state transition diagram of the cross section of the sealing plate in the extending direction of the resin portion, which illustrates the method for forming the bump electrode.
Figure 12:
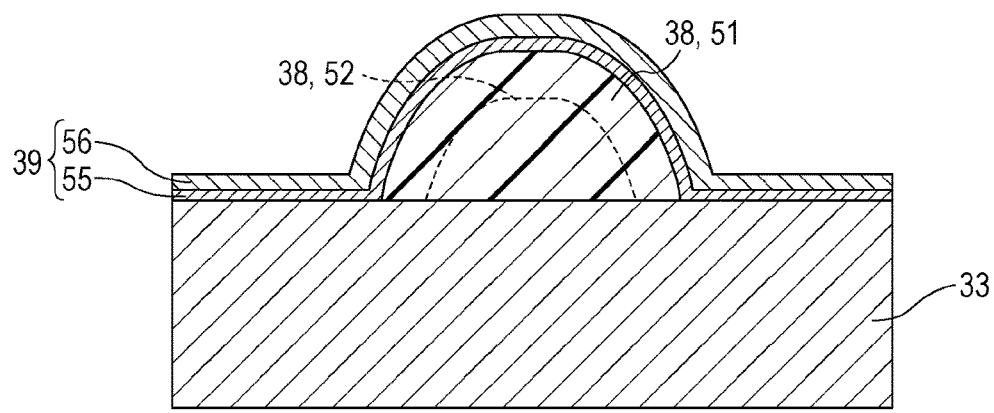
FIG. 12 is a state transition diagram of the cross section of the sealing plate in a direction orthogonal to the extending direction of the resin portion, which illustrates the method for forming the bump electrode.

Next, a method for manufacturing a recording head 3, particularly a method for forming a bump electrode 37 will be described in detail. FIG. 6 to FIG. 13 are state transition diagrams of the cross section of the sealing plate 33 for describing the method for forming the bump electrode 37. FIG. 6, FIG. 8, and FIG. 12 are cross-sectional views (that is, cross-sectional views of sealing plate 33 in direction orthogonal to extending direction of resin portion 38) of the sealing plate 33 corresponding to the cross section taken along line IV-IV in FIG. 3 and FIG. 7, FIG. 9 to FIG. 11, and FIG. 13 are cross-sectional views (that is, cross-sectional views of sealing plate 33 in extending direction of resin portion 38) of the sealing plate 33 corresponding to the cross section taken along line V-V in FIG. 3. In addition, in FIG. 6 to FIG. 13, a state where the upper and lower sides of those of FIG. 4 and FIG. 5 are reversed is illustrated for convenience of description. In other words, in FIG. 6 to FIG. 13, the lower surface side (pressure chamber forming substrate 29 side) of the sealing plate 33 is set to upper side and the upper surface side (driving IC 34 side) thereof is set to lower side.

In addition, in a resin portion forming step, the resin portion 38 is formed on a lower surface (surface in upper side in FIG. 6 and FIG. 7) of a silicon substrate (hereinafter simply referred to as a sealing plate 33) which becomes the sealing plate 33 on which the through wiring 45 and the like are formed. Specifically, for example, a resin layer is formed on the surface of the sealing plate 33, and a resin layer is formed at a predetermined position via a photolithography step or the like. In other words, a resin layer having a rectangular-shaped cross section and extending along the nozzle row direction is formed. Once the resin layer described above is formed, the sealing plate 33 is heated. The viscosity of the resin layer is decreased by the heating and the corner falls. Thereafter, the resin layer is solidified by the sealing plate 33 being cooled. As a result, as illustrated in FIG. 6 and FIG. 7, in a cross section intersecting in an extending direction of the resin portion 38, the resin portion 38 having a circular arc surface is formed.

Figure 9:
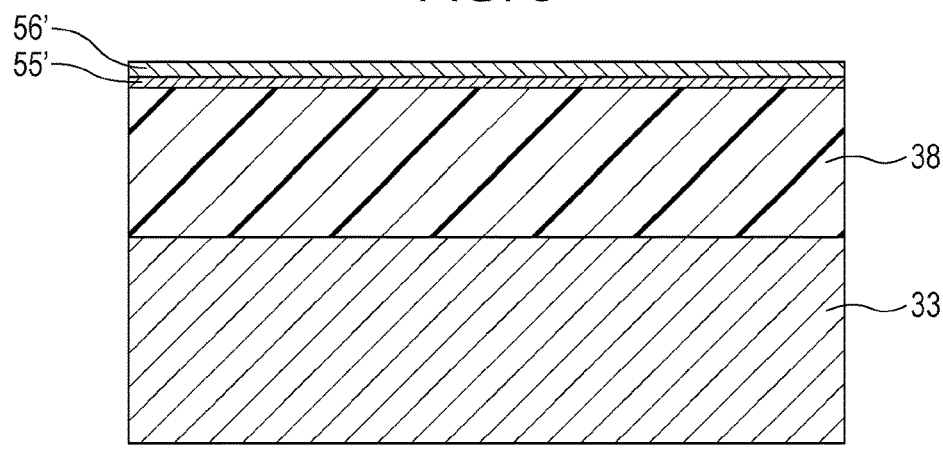
FIG. 9 is a state transition diagram of the cross section of the sealing plate in the extending direction of the resin portion, which illustrates the method for forming the bump electrode.

Next, a conductive film 39 is formed on the resin portion 38. Specifically, first, in the first film forming step, on the entire surface of the lower surface (surface in an upper side in FIG. 8 and FIG. 9) of the sealing plate 33 including a region where the resin portion 38 is formed, a metal layer 55' (corresponding to second conductive film in the invention) to be the base film 55 is formed by sputtering method or the like. Subsequently, in the second film forming step, a metal layer 56' (corresponding to first conductive film in the invention) to be the electrode film 56 is formed on the metal layer 55' to be the base film 55 by a sputtering method or the like. Accordingly, as illustrated in FIG. 8 and FIG. 9, a metal layer 55' and a metal layer 56' are stacked in this order on the lower surface of the sealing plate 33. A series of steps including the first film formation step and the second film formation step correspond to the conductive film forming step in the invention.

After forming the metal layer 55' to be the base film 55 and the metal layer 56' to be the electrode film 56 on the surface of the sealing plate 33, in the first etching step, the metal layer 55' to be the base film 55 and the metal layer 56' to be the electrode film 56 are etched to form the base film 55 and the electrode film 56 (that is, conductive film 39). Specifically, a resist layer is formed on the metal layer 56' to be the electrode film 56, and the resist layer remains at a predetermined position via a photolithography step or the like. In this state, the metal layer 55' to be the base film 55 and the metal layer 56' to be the electrode film 56 are etched by dry etching or wet etching. Accordingly, as illustrated in FIG. 10, the conductive film 39 (base film 55 and electrode film 56) is formed at a predetermined position. Next, in the second etching step, the electrode film 56 is etched so that the width of the electrode film 56 in the extending direction of the resin portion 38 is made smaller than the width of the base film 55 in the same direction. Specifically, the electrode film 56 is side-etched by wet etching using an etching solution that reacts only with the electrode film 56 while remaining the resist layer formed in the first etching step. Accordingly, as illustrated in FIG. 11, the electrode film 56 in which the width of the resin portion 38 in the extending direction is made smaller than the width of the base film 55 in the extending direction is formed. Here, by adjusting the etching time and the like of the electrode film 56, the width of the electrode film 56 in the extending direction of the resin portion 38 is set so as not to be larger than the width of the first portion 51 formed in a later step. The resist layer is removed after side-etching the electrode film 56.

Figure 13:
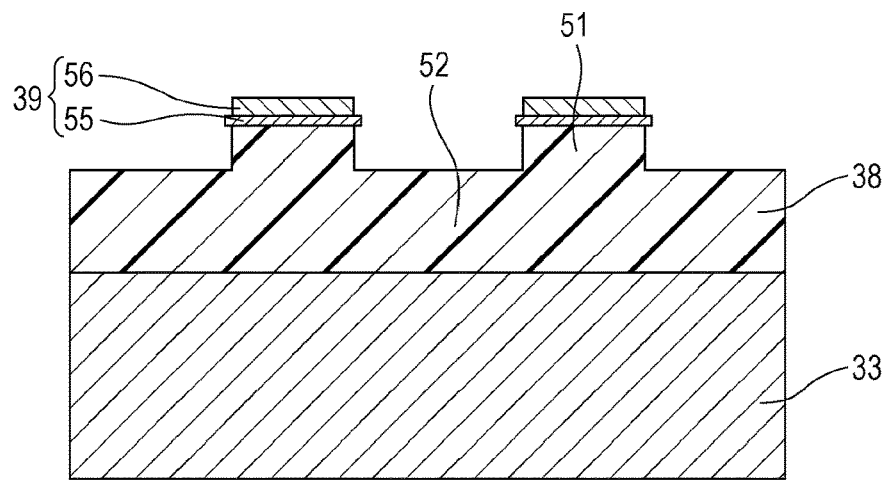
FIG. 13 is a state transition diagram of the cross section of the sealing plate in the extending direction of the resin portion, which illustrates the method for forming the bump electrode.

Thereafter, in a third etching step, the resin portion 38 is etched using the conductive film 39 (base film 55 and electrode film 56) as a mask. For example, dry etching using oxygen plasma is performed using the conductive film 39 as a mask and a portion between the conductive films 39 (portion corresponding to second portion 52) of the resin portion 38 is scraped in the height direction. Accordingly, as illustrated in FIG. 12 and FIG. 13, the surface portion of the resin portion 38 between the conductive films 39 is etched to be slightly smaller than the resin portion 38 immediately under the conductive film 39. In other words, the height of the resin portion 38 between the conductive films 39 from the surface of the sealing plate 33 becomes lower than the height from the surface of the sealing plate 33 of the resin portion 38 immediately under the conductive film 39. In other words, the first portion 51 having a relatively high height from the lower surface of the sealing plate 33 and the second portion 52 having a relatively low height from the lower surface of the sealing plate 33 are formed. At this time, as illustrated in FIG. 13, the side surface of the first portion 51 in the extending direction of the resin portion 38 is side-etched and is in a state of being hollowed inward from the base film 55. In other words, the width of the first portion 51 in the extending direction of the resin portion 38 is smaller than the width of the base film 55 in the same direction. The width (width of first portion 51 in extending direction of resin portion 38) can be changed by adjusting the etching condition of the resin portion 38. In the present embodiment, in addition to the etching condition of the electrode film 56, the width of the first portion 51 in the extending direction of the resin portion 38 is adjusted so as to be substantially the same as the width of the electrode film 56 in the same direction.

Accordingly, after the first etching step, since the second etching step of etching the electrode film 56 is performed, even if the first portion 51 is side-etched by the third etching step, the width of the first portion 51 in the extending direction of the resin portion 38 can be made equal to or larger than the width of the electrode film 56 in the same direction. In other words, the bump electrode 37 can be manufactured in which the width of the first portion 51 is formed to be equal to or larger than the width of the electrode film 56.

Then, when the bump electrodes 37 are manufactured on the lower surface of the sealing plate 33, in the substrate bonding step, in a state where the photosensitive adhesive 43 is interposed between the pressure chamber forming substrate 29 on which the piezoelectric elements 32, the vibration plate 31, and the like are formed and the sealing plate 33, the photosensitive adhesive 43 is heated and thus the photosensitive adhesive 43 is cured. Specifically, first, a photosensitive adhesive 43 is formed at a predetermined position of either one of the pressure chamber forming substrate 29 or the sealing plate 33 through an exposing step, a developing step, and the like. Next, the pressure chamber forming substrate 29 and the sealing plate 33 are opposed to each other with the photosensitive adhesive 43 interposed therebetween, and the pressure chamber forming substrate 29 and the sealing plate 33 are pressed (pressurized) in a direction in which the pressure chamber forming substrate 29 and the sealing plate 33 approach each other and are heated. By this pressing, the photosensitive adhesive 43 and the bump electrode 37 are crushed in the height direction, and the bump electrode 37 and the individual terminal 41 and the common terminal 42 corresponding thereto are electrically connected. Here, since the width of the first portion 51 is configured to be equal to or larger than the width of the electrode film 56, collapse of the shape of the bump electrode 37 can be suppressed. Then, by the heating, the photosensitive adhesive 43 is fully cured, and the pressure chamber forming substrate 29 and the sealing plate 33 are bonded.

When the photosensitive adhesive 43 is fully cured, pressing and heating are stopped, and the pressure chamber forming substrate 29 and the sealing plate 33 which are bonded to each other are cooled to a room temperature. Thereafter, the pressure chamber forming substrate 29 is polished from the lower surface side (side opposite to sealing plate 33 side) to thin the pressure chamber forming substrate 29. Next, a pressure chamber 30 is formed in the thinned pressure chamber forming substrate 29 via a photolithography step, an etching step, and the like. After the pressure chamber 30 is formed in the pressure chamber forming substrate 29, the driving IC 34 is bonded to the sealing plate 33, and the actuator unit 14 is created. After bonding the actuator unit 14 and the flow path unit 15, the flow path unit 15 to which the actuator unit 14 is bonded is bonded to the lower surface of the head case 16. Accordingly, the actuator unit 14 is accommodated in the accommodation space 17, and the recording head 3 described above is created.

Figure 14:
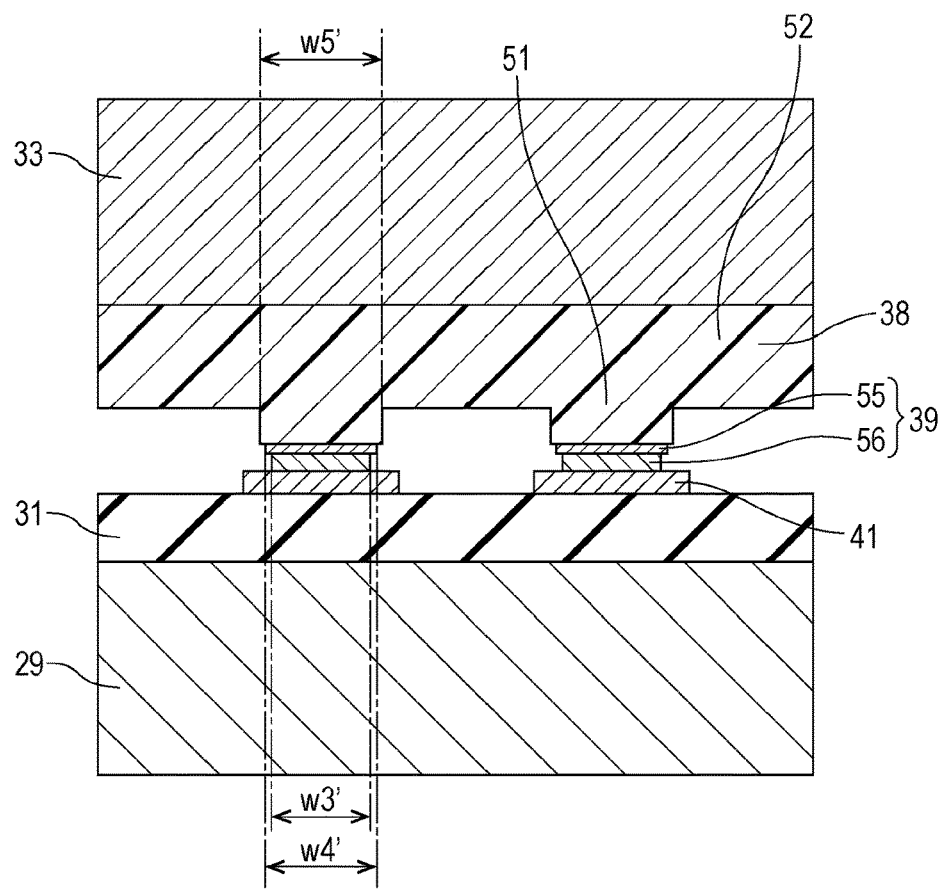
FIG. 14 is an enlarged cross-sectional view of a main portion of a sealing plate according to a second embodiment.

In the first embodiment described above, the width w4 of the base film 55 is formed to be larger than the width w5 of the first portion 51 in the extending direction of the resin portion 38, but it is not limited thereto. For example, in the second embodiment illustrated in FIG. 14, in the extending direction of the resin portion 38, the width w4' of the base film 55 is formed to be smaller than the width w5' of the first portion 51. Further, in the extending direction of the resin portion 38, the width w3' of the electrode film 56 is formed to be smaller than the width w4' of the base film 55. In other words, in the extending direction of the resin portion 38, the width w5' of the first portion 51 is larger than the width w4' of the base film 55 and the width w3' of the electrode film 56. In this manner, by making the width w5 of the first portion 51 larger than the width w4' of the base film 55 and the width w3' of the electrode film 56, the collapse of the shape of the bump electrode 37 can be further suppressed. In other words, even if the bump electrode 37 is pressed in the height direction, the first portion 51 can receive this pressure. As a result, the first portion 51 supporting the electrode film 56 is more stable as a support base, and the shape of the bump electrode 37 is less likely to collapse. As a result, the decrease in the reliability of the electrical connection at the bump electrode 37 can be further suppressed, and in turn, the decrease of the reliability of the recording head 3 can be further suppressed. Since other configurations are the same as those of the first embodiment described above, description thereof will be omitted.

Figure 15:
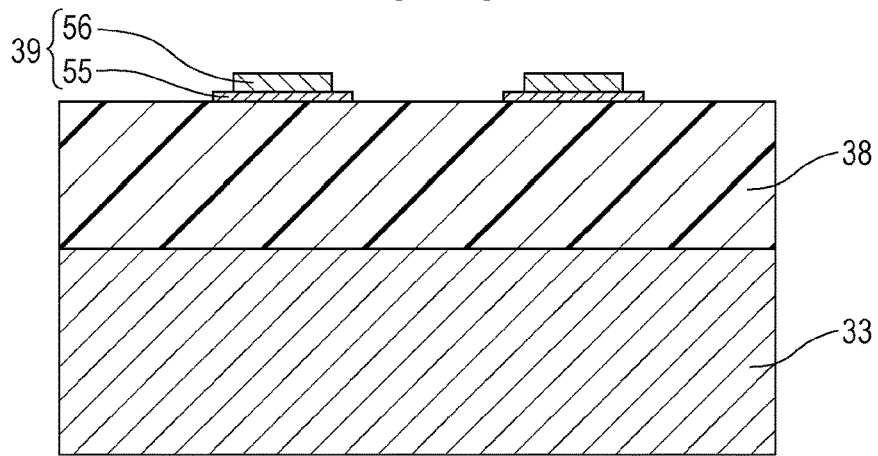
FIG. 15 is a state transition diagram of a cross section of the sealing plate in an extending direction of a resin portion, which illustrates a method for forming a bump electrode in the second embodiment.
Figure 16:
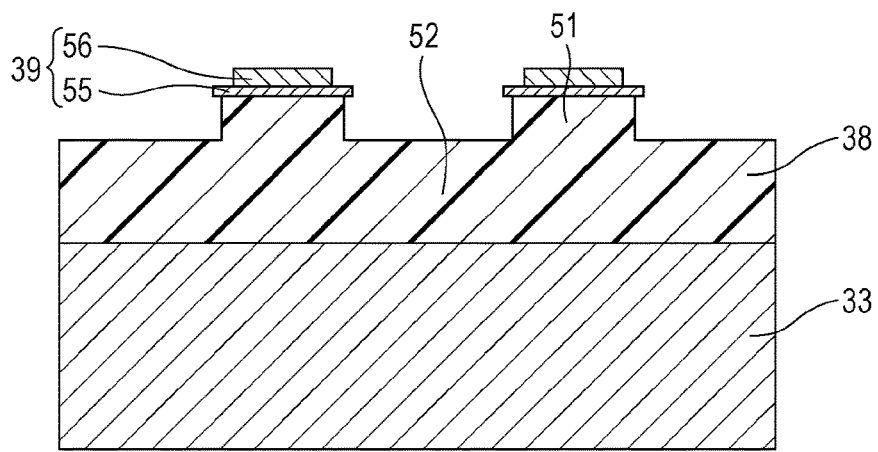
FIG. 16 is a state transition diagram of the cross section of the sealing plate in the extending direction of the resin portion, which illustrates the method for forming the bump electrode according to the second embodiment.
Figure 17:
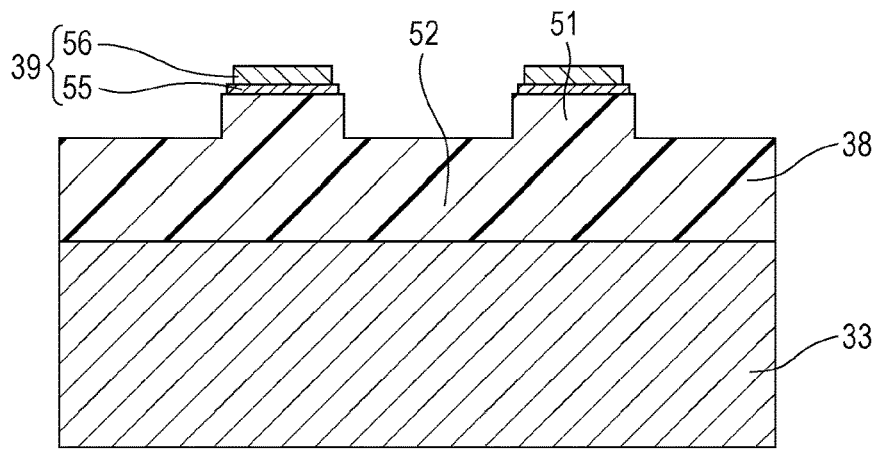
FIG. 17 is a state transition diagram of the cross section of the sealing plate in the extending direction of the resin portion, which illustrates the method for forming the bump electrode according to the second embodiment.

Next, a method for forming a bump electrode 37 in the second embodiment will be described in detail. FIG. 15 to FIG. 17 are state transition diagrams of cross sections of the sealing plates 33 for describing the method for forming the bump electrode 37 in the second embodiment. Even in FIG. 15 to FIG. 17, the lower surface side (pressure chamber forming substrate 29 side) of the sealing plate 33 is set to the upper side and the upper surface side (driving IC 34 side) is set to the lower side. In addition, since the step of decreasing the width of the electrode film 56 in the extending direction of the resin portion 38, that is, the step up to the second etching step, is the same as in the first embodiment described above after forming the conductive film 39 (base film 55 and electrode film 56) at a predetermined position, description thereof will be omitted.

Specifically, as in the first embodiment, as illustrated in FIG. 15, via the resin portion forming step, the first film forming step, the second film forming step, the first etching step, the second etching step, and the like, the electrode film 56 whose width in the extending direction of the resin portion 38, the base film 55, and the resin portion 38 is smaller than the width of the base film 55 in the same direction is formed on the lower surface of the sealing plate 33. Next, as in the first embodiment, in the third etching step, the resin portion 38 is etched using the conductive film 39 (base film 55 and electrode film 56) as a mask. Accordingly, as illustrated in FIG. 16, the first portion 51 having a relatively high height from the lower surface of the sealing plate 33 and the second portion 52 having a relatively low height from the lower surface of the sealing plate 33 are formed. In addition, in the present embodiment, the width of the first portion 51 in the extending direction of the resin portion 38 is formed to be smaller than the width of the base film 55 in the same direction. In the present embodiment, unlike the first embodiment, by adjusting the etching conditions of the resin portion 38 and the etching condition of the electrode film 56, the width of the first portion 51 in the extending direction of the resin portion 38 are formed to be larger than the width of the electrode film 56 in the same direction.

Thereafter, in the fourth etching step, the base film 55 is etched to make the width of the base film 55 in the extending direction of the resin portion 38 smaller than the width of the first portion 51 in the same direction. For example, via a photolithography step or the like, a resist layer is formed at a predetermined position, and the base film 55 is etched by dry etching or wet etching. Accordingly, as illustrated in FIG. 17, the width of the resin portion 38 in the extending direction is smaller than the width of the first portion 51 in the same direction and the base film 55 of which the width is larger than the width of the electrode film 56 in the same direction is formed. In other words, the bump electrode 37 in which the width of the first portion 51 is larger than the width of the base film 55 and the width of the electrode film 56 is formed.

Figure 18:
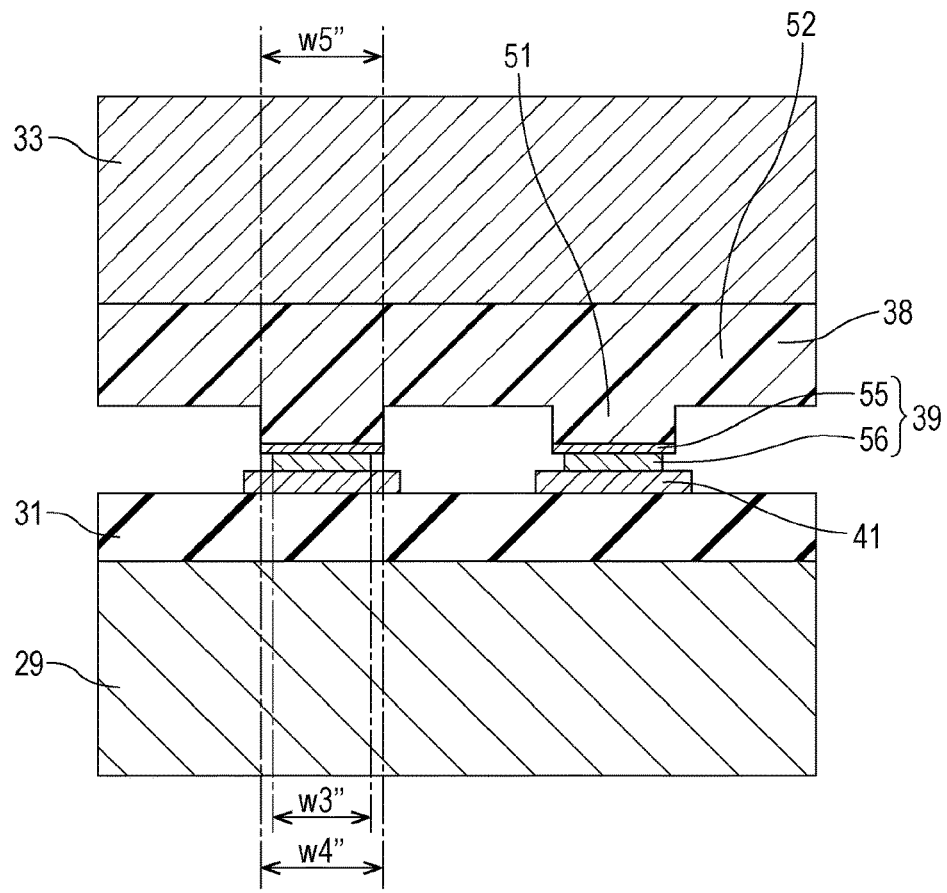
FIG. 18 is an enlarged cross-sectional view of a main portion of a sealing plate according to a third embodiment.
Figure 19:
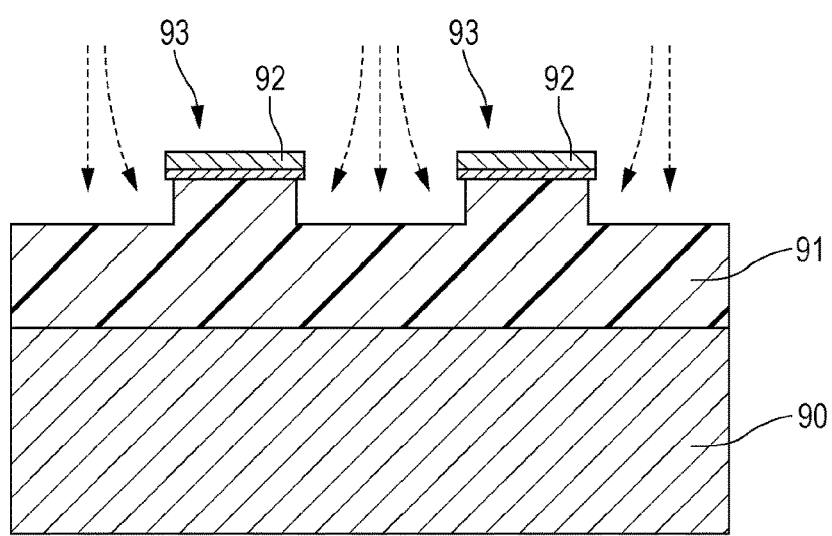
FIG. 19 is a cross-sectional view of a substrate in the extending direction of the resin portion, which illustrates the method for forming the bump electrode of the related art.

In addition, in the third embodiment illustrated in FIG. 18, in the extending direction of the resin portion 38, the width w4" of the base film 55 is formed to have substantially the same size as the width w5" of the first portion 51. In addition, in the extending direction of the resin portion 38, the width w3" of the electrode film 56 is formed to be smaller than the width w4" of the base film 55 and the width w5" of the first portion 51. As described above, by making the width w5" of the first portion 51 larger than the width w3" of the electrode film 56, the collapse of the shape of the bump electrode 37 can be also further suppressed in the present embodiment. Since other configurations are the same as those of the first embodiment described above, description thereof will be omitted. In addition, in the fourth etching step, since the method for forming the bump electrode 37 in the present embodiment is the same as the method for forming the bump electrode 37 in the second embodiment, except that the base film 55 is etched so as to have substantially the same size as the width of the first portion 51, description thereof will be omitted.

By the way, in each of the embodiments described above, the bump electrodes 37 are formed on the sealing plate 33 side, but the invention is not limited thereto. For example, a bump electrode may be formed on the pressure chamber forming substrate side. In this case, the substrate including the vibration plate and the pressure chamber forming substrate corresponds to the substrate in the invention. In addition, in each of the embodiments described above, the conductive film 39 of the bump electrode 37 is configured by two layers of the base film 55 and the electrode film 56, but it is not limited thereto. The conductive film, that is, as a wiring covering the resin portion, may configured by at least one layer. The width of the wiring of the outermost layer contacting the terminal may be equal to or smaller than the width of the resin portion. In other words, the wiring of the outermost layer corresponds to the first wiring in the invention. Furthermore, in the embodiment described above, the resin portion 38 includes the first portion 51 and the second portion 52, but it is not limited thereto. For example, it is also possible to form a state where the second portion completely in the height direction is removed and only the first portion remains.

In addition, in the above description, as an description of the configuration of the bump electrode 37 and the method for forming the bump electrode 37, attention has been given to the bump electrode 37 connected to the individual terminal 41 of one of the plurality of bump electrodes 37, but since configurations of other bump electrodes 37 (bump electrode 37 connected to other individual terminal 41, bump electrode 37 connected to common terminal 42, and the like) and the like are substantially the same as the bump electrode 37 connected to one individual terminal 41, description thereof is omitted.

In the above embodiment, although the ink jet type recording head 3 is described as an example of the liquid ejecting head, the invention can be also applied to other liquid ejecting heads. The invention can be applied to a color material ejecting head which is used for manufacturing a color filter of a liquid crystal display or the like, an electrode material ejecting head which is used for forming an electrode of an organic Electro Luminescence (EL) display, a face emitting display (FED), or the like, a bioorganic ejecting head which is used for manufacturing a biochip (biochemical element), or the like, for example. A solution of each color material of red (R), green (G), and blue (B) is ejected as a kind of liquid from a color material ejecting head for the display manufacturing apparatus. In addition, a liquid electrode material is injected as a kind of liquid from the electrode material ejecting head for an electrode forming apparatus, and a solution of bioorganic matter is ejected as a kind of liquid from the bioorganic ejecting head for a chip manufacturing apparatus.

In addition, the invention can be also applied to a MEMS device which includes a first substrate and a second substrate and includes an electrode covering a resin portion and a portion of the resin portion on any one substrate of the first substrate and the second substrate. For example, the invention can be also applied to a MEMS device including a driving region and a piezoelectric element on any one of a first substrate and a second substrate, and applying the piezoelectric element to a sensor or the like for detecting pressure change, vibration, displacement, or the like of a driving region.

The entire disclosure of Japanese Patent Application No. 2016-192983, filed Sep. 30, 2016 is expressly incorporated by reference herein.

What is claimed is:

1. A MEMS device comprising:
   a substrate having a resin portion that protrudes from one surface thereof and is made of a resin and a first wiring that covers at least a portion of a surface of the resin portion,
   wherein the first wiring extends along a first direction on the one surface from a position overlapping the resin portion to a position deviating from the resin portion, and
   wherein a width of the resin portion is equal to or larger than a width of the first wiring covering the resin portion in a second direction intersecting the first direction,
   wherein the resin portion includes a first portion and a second portion that is adjacent to the first portion along the second direction and of which a height from the one surface is lower than that of the first portion,
   wherein the first wiring is provided at a position overlapping the first portion,
   wherein a width of the first portion is equal to or larger than the width of the first wiring covering the first portion in the second direction,
   wherein a second wiring is between the first portion and the first wiring,
   wherein a width of the second wiring is equal or larger than the width of the first wiring covering the first portion in the second direction, and
   wherein the width of the second wiring is larger than the width of the first portion in the second direction.

2. A liquid ejecting head which includes a nozzle for ejecting a liquid, comprising:
   a structure of the MEMS device according to claim 1.

3. A liquid ejecting apparatus comprising:
   the liquid ejecting head according to claim 2.

* * * * *